(12) United States Patent
Cheng et al.

(10) Patent No.: US 8,896,350 B2
(45) Date of Patent: Nov. 25, 2014

(54) SAMPLING CIRCUIT AND SAMPLING METHOD

(71) Applicant: Realtek Semiconductor Corp., HsinChu (TW)

(72) Inventors: Ching-Sheng Cheng, HsinChu (TW); Hsu-Jung Tung, HsinChu (TW)

(73) Assignee: Reatek Semiconductor Corp., Hsinchu (TW)

( * ) Notice: Subject to any disclaimer, the term of this patent is extended or adjusted under 35 U.S.C. 154(b) by 0 days.

(21) Appl. No.: 14/064,553

(22) Filed: Oct. 28, 2013

(65) Prior Publication Data

US 2014/0118030 A1 May 1, 2014

(30) Foreign Application Priority Data

Oct. 31, 2012 (TW) ............................... 101140415 A

(51) Int. Cl.
*G11C 27/02* (2006.01)

(52) U.S. Cl.
USPC .................................. 327/91; 327/94; 327/95

(58) Field of Classification Search
USPC ................................................. 327/91, 94, 95
See application file for complete search history.

(56) References Cited

U.S. PATENT DOCUMENTS 5,990,719 A * 11/1999 Dai et al. ....................... 327/244
6,525,520 B2 * 2/2003 Davidsson et al. ......... 324/76.54

* cited by examiner

*Primary Examiner* — Kenneth B. Wells
(74) *Attorney, Agent, or Firm* — Muncy, Geissler, Olds & Lowe, P.C.

(57) ABSTRACT

A sampling circuit and a sampling method are provided, where the sampling circuit includes a first delay chain, a second delay chain, and a half-speed binary-phase detector. The first delay chain is used to delay an input signal according to an up signal and a down signal, so as to generate a first delay signal; and the second delay chain is used to delay the first delay signal according to a preset delay value, so as to generate a second delay signal. The half-speed binary-phase detector is used to sample a data signal according to edge trigger of the first delay signal and that of the second delay signal, and generate an output signal, an up signal, and a down signal according to a sampling result of the data signal.

12 Claims, 3 Drawing Sheets

SAMPLING CIRCUIT AND SAMPLING METHOD

CROSS-REFERENCES TO RELATED APPLICATIONS

This non-provisional application claims priority under 35 U.S.C. §119(a) on Patent Application No. 101140415 filed in Taiwan, R.O.C. on 2012 Oct. 31, the entire contents of which are hereby incorporated by reference.

BACKGROUND

1. Technical Field

The present invention relates to a sampling circuit and a sampling method, and in particular, to a sampling circuit and a sampling method capable of dynamically regulating a delay.

2. Related Art

Please refer to FIG. 1, in which a memory module 10 includes a dynamic random access memory (DRAM) 12 and a controller 14. The controller 14 accesses the DRAM 12 using a data signal DQ and a data strobe signal DQS.

Generally speaking, the memory module 10 is designed to provide a fixed delay to delay the data signal DQ and/or the data strobe signal DQS, so as to achieve the optimum efficacy of controlling the memory module. However, after the memory module 10 has been fabricated in the factory, the fixed delay cannot be dynamically changed any more.

Nevertheless, a phase of the data signal DQ and that of the data strobe signal DQS may fluctuate due to noise, or inner/outer environment changes such as a process-voltage-temperature (PVT) change, thereby deviating from a preset delay. It is therefore difficult for the memory module 10 to achieve the optimum efficacy using the fixed delay.

SUMMARY

Accordingly, an objective of the present invention is to provide a sampling circuit and a sampling method capable of dynamically regulating a delay, so as to solve the problem in the prior art.

In an embodiment, a sampling circuit includes a first delay chain, a second delay chain, and a half-speed binary-phase detector.

The first delay chain is used to delay an input signal according to an up signal and a down signal, so as to generate a first delay signal; and the second delay chain is used to delay the first delay signal according to a preset delay value, so as to generate a second delay signal. The half-speed binary-phase detector is used to sample a data signal according to edge trigger of the first delay signal and that of the second delay signal, and generate an up signal, a down signal, and an output signal according to a sampling result of the data signal.

In an embodiment, a sampling method includes delaying an input signal according to an up signal and a down signal, so as to generate a first delay signal; delaying the first delay signal according to a preset delay value, so as to generate a second delay signal; and detecting, by a half-speed binary-phase detector, edge trigger of the first delay signal and that of the second delay signal to sample a data signal, so as to generate output data, an up signal, and a down signal.

To sum up, in the sampling circuit and the sampling method of the present invention, a half-speed binary-phase detector is used to track a sampling phase, so as to dynamically regulate a delay when a working period of a clock signal (or a data strobe signal), relative to a data signal deviates from a preset delay due to noise or environment changes, so that edge trigger of the delay signals is located within a preset data significant interval of the data signal.

BRIEF DESCRIPTION OF THE DRAWINGS

The present invention will become more fully understood from the detailed description given herein below for illustration only, and thus not limitative of the present invention, wherein.

DETAILED DESCRIPTION

Figure 1:
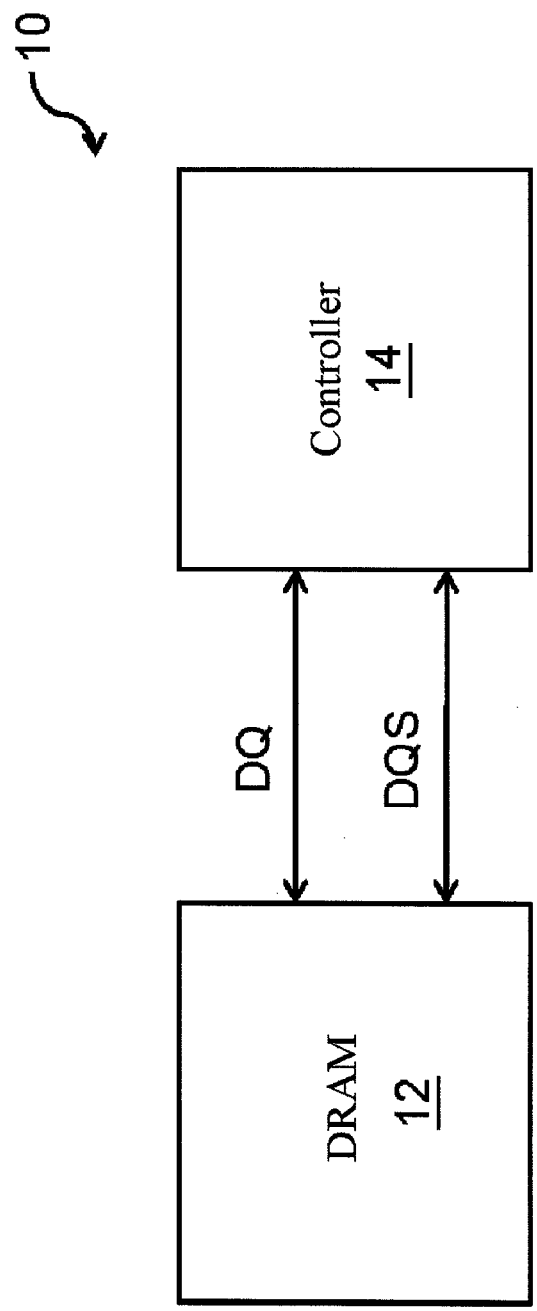
FIG. 1 is a schematic diagram of a memory module.
Figure 2:
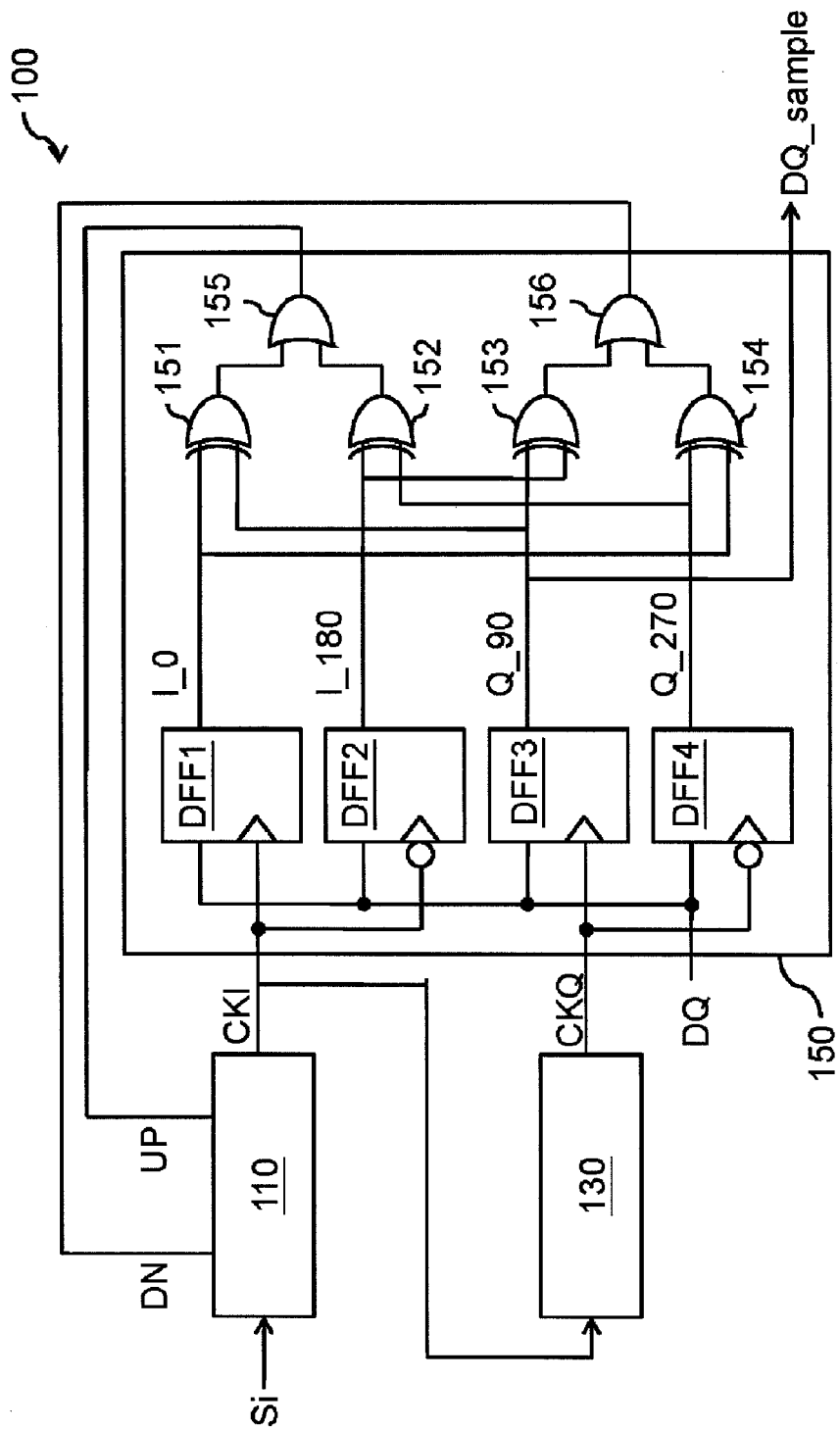
FIG. 2 is a schematic diagram of a sampling circuit according to an embodiment of the present invention.

Please refer to FIG. 2, in which the sampling circuit 100 includes a first delay chain 110, a second delay chain 130, and a half-speed binary-phase detector 150.

An output end of the first delay chain 110 is coupled to an input end of the second delay chain 130 and a first input end of the half-speed binary-phase detector 150 respectively. An output end of the second delay chain 130 is coupled to a second input end of the half-speed binary-phase detector 150. A first output end and a second output end of the half-speed binary-phase detector 150 are coupled to two control ends of the first delay chain 110 respectively.

An input end of the first delay chain 110 receives an input signal Si. The input signal Si may be a clock signal or a data strobe signal.

The two control ends of the first delay chain 110 respectively receive an up signal UP and a down signal DN from the half-speed binary-phase detector 150. At this time, the first delay chain 110 delays the input signal Si according to the up signal UP and the down signal DN, so as to generate a first delay signal CKI.

The input end of the second delay chain 130 receives an output, that is, the first delay signal CKI, of the first delay chain 110. At this time, the second delay chain 130 delays the first delay signal CKI according to a preset delay value, so as to generate a second delay signal CKQ.

The first input end and the second input end of the half-speed binary-phase detector 150 respectively receive the output of the first delay chain 110 and the output of the second delay chain 130, that is, the first delay signal CKI and the second delay signal CKQ. Meanwhile, a third input end of the half-speed binary-phase detector 150 receives a data signal DQ. Then, the half-speed binary-phase detector 150 detects edge trigger of the first delay chain 110 and that of the second delay chain 130 to sample the data signal DQ, and generates an up signal UP and a down signal DN according to a sampling result of the data signal DQ. The up signal UP and the down signal DN are output by the first output end and the second output end of the half-speed binary-phase detector 150, and are fed back to the two control ends of the first delay chain 110, so as to regulate and control a delay of the first delay chain 110. The up signal UP is used to regulate the delay of the first delay chain 110 down, and the down signal DN is used to regulate the delay of the first delay chain 110 up. That is, the delay of the first delay chain 110 may be regulated down in response to the up signal UP, or the delay of the first delay chain 110 may be regulated up in response to the down signal DN.

A phase difference between the first delay signal CKI and the second delay signal CKQ is the preset delay value. The preset delay value generally ranges from a quarter period to a half period of the data signal DQ, but is not limited thereto. In some embodiments, the preset delay vale may be set by system software. In this embodiment, preferably, the phase difference between the first delay signal CKI and the second delay signal CKQ, that is, the preset delay value of the second delay chain 130, may be a quarter period (about 90 degrees), of the data signal DQ.

In some embodiments, each of the first delay chain 110 and the second delay chain 130 may be implemented by at least one delay unit. The operations and principles of the first delay chain 110 and the second delay chain 130 known to persons skilled in the art, so the details are not described herein again.

In some embodiments, the half-speed binary-phase detector 150 includes a plurality of sampling units and a plurality of logic units 151 to 156. The sampling units sample the data signal according to edge trigger of the first delay signal and that of the second delay signal, so as to generate a plurality of sampled data. The logic units 151 to 156 perform a logic operation on the sampled data, so as to generate the up signal UP and the down signal DN. Each sampling unit may be implemented by adopting a flip-flop.

In this embodiment, four flip-flops, respectively referred to as a first flip-flop DFF1, a second flip-flop DFF2, a third flip-flop DFF3, and a fourth flip-flop DFF4 below, are taken as an example.

A control end of the first flip-flop DFF1 and that of the second flip-flop DFF2 are coupled to the first input end of the half-speed binary-phase detector 150, so as to receive the first delay signal CKI. A control end of the third flip-flop DFF3 and that of the fourth flip-flop DFF4 are coupled to the second input end of the half-speed binary-phase detector 150, so as to receive the second delay signal CKQ. The input ends of the first flip-flop DFF1, the second flip-flop DFF2, the third flip-flop DFF3, and the fourth flip-flop DFF4 are all coupled to the third input end of the half-speed binary-phase detector 150, so as to receive the data signal DQ.

The first flip-flop DFF1 detects rising edge trigger of the first delay signal CKI to sample the data signal DQ, so as to generate first sampled data I_0. The second flip-flop DFF2 detects falling edge trigger of the first delay signal CKI to sample the data signal DQ, so as to generate second sampled data I_180. The third flip-flop DFF3 detects rising edge trigger of the second delay signal CKQ to sample the data signal DQ, so as to generate third sampled data I_90. The fourth flip-flop DFF4 detects filling edge trigger of the second delay signal CKQ to sample the data signal DQ, so as to generate fourth sampled data I_270.

The logic unit 151 receives an output of the first flip-flop DFF1 and an output of the third flip-flop DFF3, that is, the first sampled data I_0 and the third sampled data Q_90. Additionally, the logic unit 151 performs a logic operation on the first sampled data I_0 and the third sampled data Q_90, so as to generate an output signal to the logic unit 155. The logic unit 152 receives an output of the second flip-flop DFF2 and an output of the fourth flip-flop DFF4, that is, the second sampled data I_180 and the fourth sampled data Q_270. Additionally, the logic unit 152 performs a logic operation on the second sampled data I_180 and the fourth sampled data Q_270, so as to generate an output signal to the logic unit 155. The logic unit 155 performs a logic operation on the output signals of the two logic units 151 and 152 to generate the up signal UP.

The logic unit 153 receives an output of the second flip-flop DFF2 and an output of the third flip-flop DFF3, that is, the second sampled data I_180 and the third sampled data Q_90. Additionally, the logic unit 153 performs a logic operation on the second sampled data I_180 and the third sampled data Q_90, so as to generate an output signal to the logic unit 156. The logic unit 154 receives an output of the first flip-flop DFF1 and an output of the fourth flip-flop DFF4, that is, the first sampled data I_0 and the fourth sampled data Q_270. Additionally, the logic unit 154 performs a logic operation on the first sampled data I_0 and the fourth sampled data Q_270, so as to generate an output signal to the logic unit 156. The logic unit 156 performs a logic operation on the output signals of the two logic units 153 and 154 to generate the down signal DN.

In some embodiments, the logic units 151 to 154 may be exclusive-OR (XOR) gates, and the logic units 155 and 156 may be OR gates. In this embodiment, the third sampled data Q_90 is used as the output signal DQ_sample, but is not limited thereto, and other sampled data may also be used as the output signal DQ_sample according to actual demands.

The second delay chain 130 has a fixed delay, for example, 90 degrees. The first delay chain 110 has a regulatable delay. Therefore, the first delay chain 110 adjusts the delay in response to the up signal UP and the down signal DN, and then delays the input signal Si according to the regulated delay, so as to obtain the first delay signal CKI.

Figures 3A, 3B:
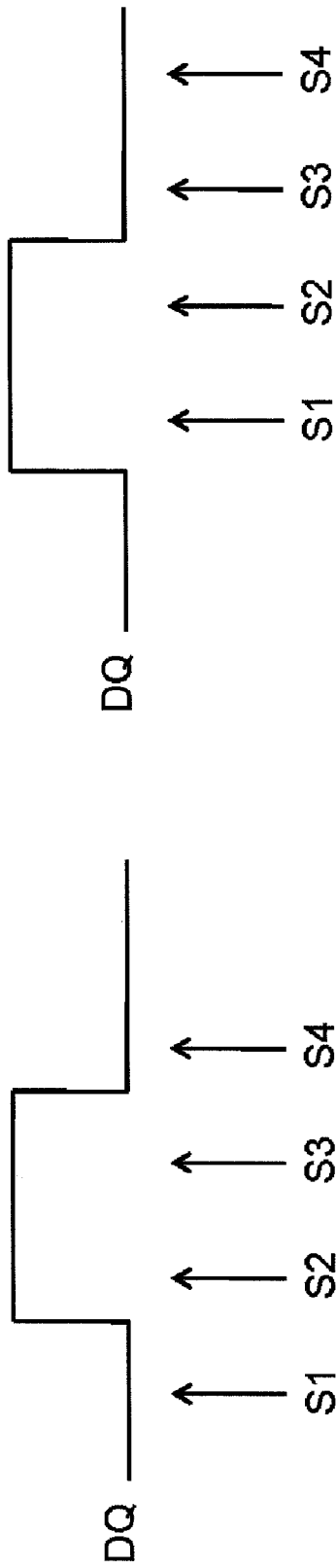
FIG. 3A is a schematic diagram phase lagging of a clock signal in an embodiment.
FIG. 3B is a schematic diagram showing phase leading of a clock signal in an embodiment.

For example, Please refer to FIG. 3A and FIG. 3B, in which the first sampled data I_0 represents a sampling point S1 at 0-degree phase, the second sampled data I_180 represents a sampling point S3 at 180-degree phase, the third sampled data Q_90 represents a sampling point S2 at 90-degree phase, and the fourth sampled data Q_270 represents a sampling point S4 at 270-degree phase. Please refer to FIG. 3A, in which when the phase of the input signal Si relative to the data signal DQ lags behind (late) due to noise and/or environment changes or other factors, the logic unit 155 outputs an up signal UP being [1], and the logic unit 156 outputs a down signal DN being [0], so that the first delay chain 110 decreases the delay. Please refer to FIG. 3B, in which when the phase of the input signal Si relative to the data signal DQ leads before (early) due to noise and/or environment changes or other factors, the logic unit 155 outputs an up signal UP being [0], and the logic unit 156 outputs a down signal DN being [1], so that the first delay chain 110 increases the delay. That is, the half-speed binary-phase detector 150 adjusts, using the up signal UP and the down signal DN, the delay of the first delay chain 110 according to a phase difference between the output signal DQ_sample and the data signal DQ, as well as the preset delay value. That is to say, even if a phase different exists between the input signal Si and the data signal DQ, the half-speed binary-phase detector 150 offsets the phase difference by regulating the first delay chain 110, so that the data signal DQ is sampled and output actually according to a phase difference (or an integral multiple thereof), between the input signal Si and the preset delay value. Therefore, the rising edge trigger of the second delay signal CKQ is located within a preset data significant interval of the data signal DQ by regulating the delay of the first delay chain 110. Preferably, the rising edge trigger of the second delay signal CKQ may be dynamically regulated at a central point of the data significant interval of the data signal DQ.

The sampling circuit and the sampling method according to the present invention may be applied in a circuit for processing digital signals, so as to ensure correct sampling of the data. For example, the sampling circuit according to the present invention may be applied in a data access interface circuit of a Double Data Rate (DDR) memory, so as to ensure correct sampling of the data.

To summarize, in the sampling circuit and the sampling method of the present invention, a half-speed binary-phase detector is used to track a sampling phase, so as to dynamically adjust a delay when a working period of an input signal (a clock signal or a data strobe signal), relative to the data signal deviates from the preset delay due to noise and/or environment changes, so that edge trigger of the delay signals is located within a preset data significant interval of the data signal, thereby ensuring more correct sampling of the data.

It should be noted that persons skilled in that art can design different preset delay values, sampling units, and logic units according to the disclosure of the present invention.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A sampling circuit, comprising:
   a first delay chain, for delaying an input signal according to an up signal and a down signal, to generate a first delay signal;
   a second delay chain, for delaying the first delay signal according to a preset delay value, to generate a second delay signal; and
   a half-speed binary-phase detector, for sampling a data signal according to edge trigger of the first delay signal and that of the second delay signal, and generate the up signal, the down signal, and an output signal according to a sampling result of the data signal.

2. The sampling circuit according to claim 1, wherein the half-speed binary-phase detector regulates, using the up signal and the down signal, a delay of the first delay chain according to the preset delay value and a phase difference between the output signal and the data signal.

3. The sampling circuit according to claim 1, wherein the half-speed binary-phase detector comprises:
   a plurality of sampling units, for detecting the edge trigger of the first delay signal and that of the second delay signal, to sample the data signal to generate a plurality of sampled data; and
   a plurality of logic units, for performing a logic operation on the sampled data to generate the up signal and the down signal.

4. The sampling circuit according to claim 2, wherein each of the sampling units comprises: a flip-flop, for detecting the edge trigger of one of the first delay signal and the second delay signal to sample the data signal.

5. The sampling circuit according to claim 1, wherein a phase difference between the first delay signal and the second delay signal ranges from a quarter period to a half period of the data signal.

6. The sampling circuit according to claim 1, wherein the half-speed binary-phase detector comprises:
   a first flip-flop, for detecting rising edge trigger of the first delay signal to sample the data signal, to generate first sampled data;
   a second flip-flop, for detecting falling edge trigger of the first delay signal to sample the data signal, to generate second sampled data;
   a third flip-flop, for detecting rising edge trigger of the second delay signal to sample the data signal, to generate third sampled data;
   a fourth flip-flop, for detecting falling edge trigger of the second delay signal o sample the data signal, to generate fourth sampled data; and
   a plurality of logic units, for performing a logic operation on the first sampled data, the second sampled data, the third sampled data, and the fourth sampled data, to generate the up signal and the down signal.

7. The sampling circuit according to claim 1, wherein the input signal is a clock signal or a data strobe signal.

8. A sampling method, comprising:
   delaying an input signal according to an up signal a down signal, so as to generate a first delay signal;
   delaying the first delay signal according to a preset delay value, so as to generate a second delay signal; and
   sampling, by a half-speed binary-phase detector, a data signal according to edge trigger of the first delay signal and that of the second delay signal, so as to generate output data, the up signal, and the down signal.

9. The sampling method according to claim 8, wherein the detection step comprises:
   detecting rising edge trigger of the first delay signal to sample the data signal, so as to generate first sampled data;
   detecting falling edge trigger of the first delay signal to sample the data signal, so as to generate second sampled data;
   detecting rising edge trigger of the second delay signal to sample the data signal, so as to generate third sampled data;
   detecting falling edge trigger of the second delay signal to sample the data signal, so as to generate fourth sampled data;
   performing a logic operation on the first sampled data, the second sampled data, the third sampled data, and the fourth sampled data, so as to generate the up signal and the down signal; and
   using the third sampled data as the output data.

10. The sampling method according to claim 8, wherein the step of delaying the clock signal comprises:
    regulating a delay in response to the up signal and the down signal; and
    delaying the clock signal according to the delay, so as to generate the first delay signal.

11. The sampling method according to claim 8, wherein a phase difference between the first delay signal and the second delay signal ranges from a quarter period to a half period of the data signal.

12. The sampling method according to claim 8, wherein the input signal is a clock signal or a data strobe signal.

* * * * *